(12) United States Patent
Kang

(10) Patent No.: US 6,953,710 B2
(45) Date of Patent: Oct. 11, 2005

(54) METHOD FOR PACKAGING A SEMICONDUCTOR DEVICE

(75) Inventor: Byoung Young Kang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/751,199

(22) Filed: Dec. 30, 2003

(65) Prior Publication Data

US 2004/0157366 A1    Aug. 12, 2004

(30) Foreign Application Priority Data

Dec. 30, 2002  (KR) ....................... 10-2002-0086651

(51) Int. Cl.[7] .................. H01L 21/50; H01L 23/28
(52) U.S. Cl. .................. 438/122; 438/127; 257/796
(58) Field of Search ..................... 438/118–127, 669, 438/670, 700; 257/675, 706, 717–719, 787–796

(56) References Cited

U.S. PATENT DOCUMENTS 5,271,887 A * 12/1993 Wiech, Jr. .................. 264/614
6,657,296 B2 * 12/2003 Ho et al. .................... 257/720
2005/0003586 A1 * 1/2005 Shimanuki et al. ......... 438/124

* cited by examiner

*Primary Examiner*—David Nelms
*Assistant Examiner*—Calvin Lee
(74) *Attorney, Agent, or Firm*—Andrew D. Fortney

(57) ABSTRACT

A method for packaging a semiconductor device includes the steps of forming a plurality of grooves on an upper surface of a substrate, attaching a heat sink on the substrate, attaching a chip to the substrate by using an adhesive, wire-bonding the substrate and the chip and encapsulating and sealing the substrate and the chip by using an epoxy molding compound. The grooves formed on the substrate enlarges an area where the substrate and the epoxy molding compound attached thereto contact with each other, which improves the operational reliability of the semiconductor device. Further, the heat sink attached to the substrate facilitates a dissipation of heat generated during the operation of the semiconductor device, which prevents failure of the semiconductor device.

2 Claims, 1 Drawing Sheet

METHOD FOR PACKAGING A SEMICONDUCTOR DEVICE

FIELD OF THE INVENTION

The present invention relates to a method for packaging a semiconductor device; and, more particularly, to a method for packaging a semiconductor device including a substrate having grooves thereon and a heat sink attached thereto to improve the heat dissipating efficiency.

BACKGROUND OF THE INVENTION

FIG. 1 illustrates a sectional view of a BGA package fabricated in accordance with a method of the prior art. As shown in FIG. 1, in accordance with the prior art, a chip 106 is attached to a substrate 100 through an adhesive 102. Thereafter, the chip 106 is interconnected with the substrate 100 through a gold wire 104. Then, the chip 106 and the gold wire 104 are encapsulated and sealed by using an epoxy molding compound 108. Solder balls 110 are then attached to the substrate 100 and subject to a reflow process. Subsequently, the substrate is sawed to singulate individual packages, by which a fabrication of the BGA package is completed.

However, the BGA package of the prior art has problems that it is hard to miniaturize the package and the package has insufficient heat transfer capability.

SUMMARY OF THE INVENTION

It is, therefore, an object of the present invention to provide a method for packaging a semiconductor device including a substrate having grooves thereon and a heat sink attached thereto to improve the heat dissipating efficiency.

In accordance with a preferred embodiment of the present invention, there is provided a method for packaging a semiconductor device, including the steps of: (a) forming a plurality of grooves on an upper surface of a substrate; (b) attaching a heat sink on the substrate; (c) attaching a chip to the substrate by using an adhesive; (d) wire-bonding the substrate and the chip; and (f) encapsulating and sealing the substrate and the chip by using an epoxy molding compound.

BRIEF DESCRIPTION OF THE DRAWINGS

The above and other object and features of the present invention will become apparent from the following description of preferred embodiments given in conjunction with the accompanying drawings, in which.

DETAILED DESCRIPTION OF THE PREFERRED EMBODIMENT

Figure 1:
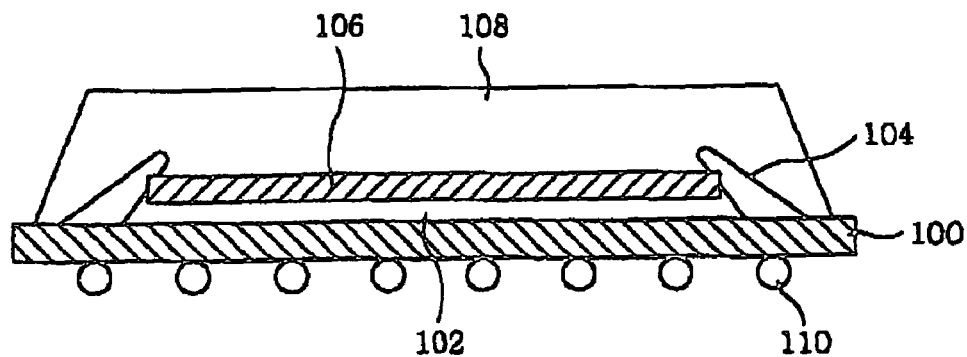
FIG. 1 describes a sectional view of a BGA package fabricated by using a method in accordance with the prior art.
Figure 2:
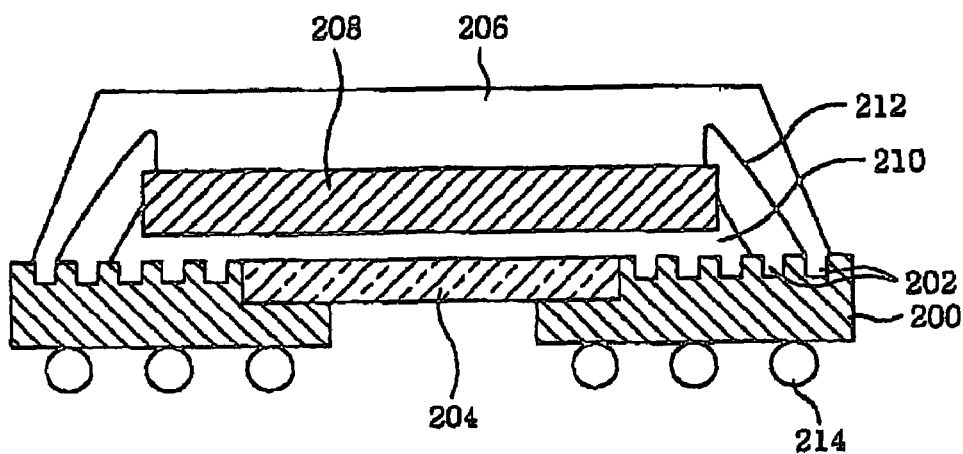
FIG. 2 depicts a sectional view of a BGA package fabricated by using a method in accordance with a preferred embodiment of the present invention.

FIG. 2 illustrates a sectional view of a BGA package fabricated by using a method in accordance with a preferred embodiment of the present invention. In the following, the method of the present invention will be described in detail with reference to FIG. 2.

As shown in FIG. 2, first, grooves 202 are formed on an upper surface of a substrate 200. Then, a heat sink 204 for improving heat dissipation efficiency is attached to the substrate 200. Herein, the grooves formed on the substrate 200 enlarges an area where the substrate 200 and an epoxy molding compound 206 to be attached thereto contact with each other, which improves the operational reliability of the semiconductor device. Further, the heat sink 204 attached to the substrate 200 facilitates a dissipation of heat generated during the operation of the semiconductor device, which prevents failure of the semiconductor device.

Thereafter, a chip 208 is attached to the substrate 200 by using an adhesive 210. The chip 208 and the substrate 200 is wire-bonded by using a gold wire 212 and then encapsulated and sealed by using an epoxy molding compound 206. Subsequently, solder balls 214 are attached to the substrate 200 and subject to a reflow process. Finally, the substrate 200 is sawed to singulate individual packages.

As described above, in accordance with present invention, the grooves formed on the substrate enlarges an area where the substrate and the epoxy molding compound attached thereto contact with each other, which improves the operational reliability of the semiconductor device. Further, the heat sink attached to the substrate facilitates a dissipation of heat generated during the operation of the semiconductor device, which prevents failure of the semiconductor device.

While the invention has been shown and described with respect to the preferred embodiments, it will be understood by those skilled in the art that various changes and modifications may be made without departing from the spirit and scope of the invention as defined in the following claims.

What is claimed is:

1. A method for packaging a semiconductor device, comprising the steps of:
   (a) forming a plurality of grooves on an upper surface of a substrate;
   (b) attaching a heat sink on the upper surface of the substrate;
   (c) attaching a chip to the substrate using an adhesive;
   (d) wire-bonding the substrate and the chip; and
   (e) encapsulating and sealing the substrate and the chip by using an epoxy molding compound,
   wherein the epoxy molding compound is attached the substrate through the plurality of grooves.

2. The method of claim 1, wherein at least one surface of the heat sink is exposed to the atmosphere.

* * * * *